United States Patent
Wu et al.

(10) Patent No.: US 10,802,392 B2
(45) Date of Patent: Oct. 13, 2020

(54) PHOTOMASK LASER ETCH

(71) Applicant: Applied Materials, Inc., Santa Clara, CA (US)

(72) Inventors: Banqiu Wu, San Jose, CA (US); Eli Dagan, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/510,855

(22) Filed: Jul. 12, 2019

(65) Prior Publication Data

US 2020/0057362 A1    Feb. 20, 2020

Related U.S. Application Data (60) Provisional application No. 62/764,911, filed on Aug. 16, 2018.

(51) Int. Cl.
| | |
|---|---|
| *G03F 1/00* | (2012.01) |
| *G03F 1/54* | (2012.01) |
| *G03F 1/46* | (2012.01) |
| *G03F 1/80* | (2012.01) |

(52) U.S. Cl.
CPC .............. *G03F 1/003* (2013.01); *G03F 1/54* (2013.01); *G03F 1/46* (2013.01); *G03F 1/80* (2013.01)

(58) Field of Classification Search
CPC ... G03F 1/003; G03F 1/54; G03F 1/38; G03F 1/68; G03F 1/62; G03F 1/22
USPC ...................................... 216/65, 94
See application file for complete search history.

(56) References Cited

U.S. PATENT DOCUMENTS

| | | |
|---|---|---|
| 4,440,841 A | 4/1984 | Tabuchi |
| 5,861,603 A | 1/1999 | Miyachi et al. |
| 6,245,486 B1 | 6/2001 | Teng |
| 6,803,160 B2 | 10/2004 | Johnstone et al. |
| 7,014,959 B2 | 3/2006 | Crawford et al. |
| 7,473,501 B1 | 1/2009 | Zhou et al. |
| 7,785,754 B2 | 8/2010 | Sim et al. |
| 2005/0153564 A1 | 7/2005 | Mak et al. |

(Continued)

FOREIGN PATENT DOCUMENTS

| | | |
|---|---|---|
| TW | 201721281 A | 6/2017 |
| WO | 2017090485 A1 | 6/2017 |

OTHER PUBLICATIONS

RP Photonics Encyclopedia; "Femtosecond Lasers" via https://www.rp-photonics.com/femtosecond_lasers.html ; pp. 1-14; No date available.*

(Continued)

*Primary Examiner* — Binh X Tran
(74) *Attorney, Agent, or Firm* — Patterson + Sheridan, LLP (57) ABSTRACT

Embodiments described herein relate to apparatus and methods for removing one or more films from a photomask to create a black border and one or more pellicle anchor areas thereon. A photomask substrate is exposed by removing the one or more films in the black border and pellicle anchor areas. The black border prevents a pattern on the photomask from overlapping a pattern on a substrate being processed. To create the black border and pellicle anchor areas, a laser beam is projected through a lens and focused on a surface of the films. The films are ablated by the laser beam without damaging the photomask substrate.

20 Claims, 4 Drawing Sheets

(56) References Cited

U.S. PATENT DOCUMENTS

| | | | |
|---|---|---|---|
| 2012/0156875 A1* | 6/2012 | Srinivas | B23K 26/36 |
| | | | 438/675 |
| 2013/0029253 A1 | 1/2013 | Mangat et al. | |
| 2016/0035577 A1* | 2/2016 | Lei | B23K 26/40 |
| | | | 438/462 |
| 2016/0086852 A1* | 3/2016 | Holden | H01J 37/32715 |
| | | | 438/462 |
| 2016/0139501 A1 | 5/2016 | Kim et al. | |
| 2016/0370680 A1* | 12/2016 | Geerlings | G02F 1/155 |
| 2017/0278801 A1* | 9/2017 | Park | B23K 26/064 |
| 2018/0031962 A1 | 2/2018 | Chou et al. | |
| 2019/0279902 A1* | 9/2019 | Park | H01L 21/2633 |
| 2020/0008305 A1* | 1/2020 | Clark | B23K 26/355 |
| 2020/0152527 A1* | 5/2020 | Jeunink | H01L 21/31122 |

OTHER PUBLICATIONS

International Search Report and Written Opinion dated Oct. 25, 2019 for Application No. PCT/US2019/040644.

Taiwan Office Action dated May 25, 2020 for Application No. 108128046.

\* cited by examiner

PHOTOMASK LASER ETCH

CROSS REFERENCE TO RELATED APPLICATIONS

This application claims benefit of U.S. Provisional Patent Application No. 62/764,911, filed Aug. 16, 2018, the entirety of which is herein incorporated by reference.

BACKGROUND

Field

Embodiments of the present disclosure generally relate to the field of semiconductor manufacturing equipment, and more specifically, apparatus and methods for removing one or more films from a photomask.

Description of the Related Art

During photolithography, a photomask is used to transfer a pattern on the photomask to a substrate. A black border around the pattern on the photomask may prevent EUV (extreme ultraviolet) light passing through the pattern on the photomask from affecting an adjacent pattern formed on the substrate. The black border is an area on the photomask that does not have any films or coatings deposited thereon.

A pellicle is often disposed on the photomask to prevent particles from damaging and contaminating the photomask. The pellicle is a thin transparent film that does not affect the pattern generated by light passing through the photomask. Generally, the pellicle is glued to the photomask. However, if the pellicle is glued to a film on the photomask, the film may delaminate from the photomask when the pellicle is removed. Thus, a pellicle anchor area is formed through the films or coatings deposited on the substrate so that the glue adheres directly to the photomask substrate.

Conventional techniques to create the black border and pellicle anchor areas include plasma etching. However, these conventional techniques are complex and time consuming. For example, after the pattern is fabricated on the photomask, any photoresist used in the plasma etching process is removed from the photomask and cleaning chemicals are applied to clean the photomask. A second photoresist is deposited on the photomask and an etch process is used to remove various films or layers from the black border and the pellicle anchor areas. Cleaning chemicals are again applied to the photomask to remove any remaining photoresist. The cleaning chemicals used to clean the photomask often result in damage to the photomask.

Thus, an improved technique to process a photomask is needed.

SUMMARY

In one embodiment, a laser etch method is provided. The method includes etching a photomask to remove a first layer disposed on the photomask from a black border and one or more pellicle anchor areas. The photomask is etched with a femtosecond laser and a lens having a focal length between about 30 mm and about 110 mm to remove at least a second layer disposed on the photomask from the black border. The photomask is also etched with the femtosecond laser to remove at least the second layer from the one or more pellicle anchor areas. Residual photoresist is removed from the photomask with the femtosecond laser.

In another embodiment, an apparatus is provided which includes a chamber body and lid assembly defining a first volume therein. A pedestal is disposed within the first volume and capable of supporting the photomask. A lens having a focal length of between about 30 mm and about 110 mm is disposed in the chamber body opposite the pedestal. An ablation apparatus is positioned within the first volume. The ablation apparatus includes a sidewall surrounding a second volume and a femtosecond laser source configured to emit a laser beam through the second volume to remove material from the photomask without damaging the photomask. The laser source has a power of about 100 mW or less.

In yet another embodiment, an apparatus is provided which includes a cleaning chamber, a plasma chamber, and a laser etch chamber. The laser etch chamber includes a chamber body and lid assembly defining a first volume therein. A pedestal is disposed within the first volume and capable of supporting a photomask. A lens having a focal length of between about 30 mm and about 110 mm is disposed within the first volume opposite the pedestal. An ablation apparatus is positioned within the first volume between the lens and the pedestal. The ablation apparatus includes a sidewall surrounding a second volume and a femtosecond laser source configured to emit a laser beam through the second volume to remove material from the photomask without damaging the photomask. The laser source has a power of about 100 mW or less.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to apparatus and methods for removing one or more films from a photomask to create a black border and one or more pellicle anchor areas thereon. By removing the one or more films, a photomask substrate is exposed in the black border and pellicle anchor areas. The black border prevents a pattern on the photomask from overlapping a pattern on a substrate being processed. To create the black border and pellicle anchor areas, a laser beam is projected through a lens and focused on a surface of the films. The films are ablated by the laser beam without damaging the photomask substrate.

One or more embodiments disclosed herein relate to apparatus and methods for removal of one or more portions of films from a photomask used for extreme ultraviolet (EUV) lithography. However, it is contemplated that the embodiments described herein may be utilized for other photolithography processes which utilize a photomask.

A black border and one or more pellicle anchor areas are formed through one or more films disposed on a photomask substrate. The photomask substrate is exposed where the one or more films are removed. Thus, the black border and pellicle anchor areas are created by removing all films from a portion of the photomask.

The black border prevents EUV light passing through the photomask from affecting an adjacent pattern formed on the substrate being processed. For example, EUV light passing through the photomask may create a pattern on the substrate being processed. However, the EUV light passing through the photomask produces a pattern on the substrate that overlaps an adjacent pattern on the substrate. The overlapping portion of the pattern may damage the adjacent pattern. To substantially reduce the overlapping portion of the pattern, the black border is formed through the one or more films disposed on the photomask. That is, the black border has reduced reflectivity of EUV light and is opaque to wavelengths of EUV light. Thus, the black border substantially reduces the EUV light passing through the photomask, which overlaps an adjacent pattern on the substrate.

The pellicle anchor areas are formed through the one or more films disposed on the photomask. A pellicle is adhered to the photomask to prevent particles from damaging the photomask. If the pellicle is adhered to a film on the photomask, the glue used to secure the pellicle can delaminate the film from the photomask. Thus, the pellicle anchor areas are formed through the films to expose the photomask substrate and enable the pellicle glue to adhere to the photomask substrate.

Conventional techniques for removing a portion of one or more films utilize a plasma etch process. However, this technique is inefficient and time consuming because a photoresist is added to the photomask prior to etching each individual film. Once a plasma etch process is performed on a particular film, the photoresist is removed and the photomask is cleaned using a cleaning solution. Before etching a subsequent film, a photoresist is added to the photomask. The photoresist is again removed and the photomask is cleaned using the cleaning solution. Thus, a cleaning solution is applied to the photomask for each layer that is etched. However, the cleaning solutions used can damage the photomask.

Further, conventional plasma etch processes result in a rough sidewall of the black border. The roughness of the sidewall affects an amount of overlap of the pattern onto an adjacent pattern on the substrate being processed. A more accurate etch of the black border (e.g., having a smooth sidewall) enables processing of a pattern while substantially minimizing an overlap of the pattern onto an adjacent pattern on the substrate.

Improved techniques for removing a portion of one or more films deposited on a photomask substrate are described herein. Embodiments described herein provide techniques for removing a portion of the one or more films using laser energy without damaging the photomask substrate. A laser source is used to remove a portion of the films without increasing a temperature of the material being ablated or increasing a temperature of the photomask substrate.

To prevent a temperature increase, a low power laser is used. The laser source may have a power of about 100 mW or less. The low power laser also prevents damage to the photomask substrate. For example, a laser source having a power of more than about 200 mW may damage the photomask substrate. A short pulse duration may also be used to prevent heat transfer to the material being ablated. For example, the pulse duration of the laser source may be between about 200 femtoseconds (fsec) and about 300 fsec, such as about 250 fsec.

Figure 1:
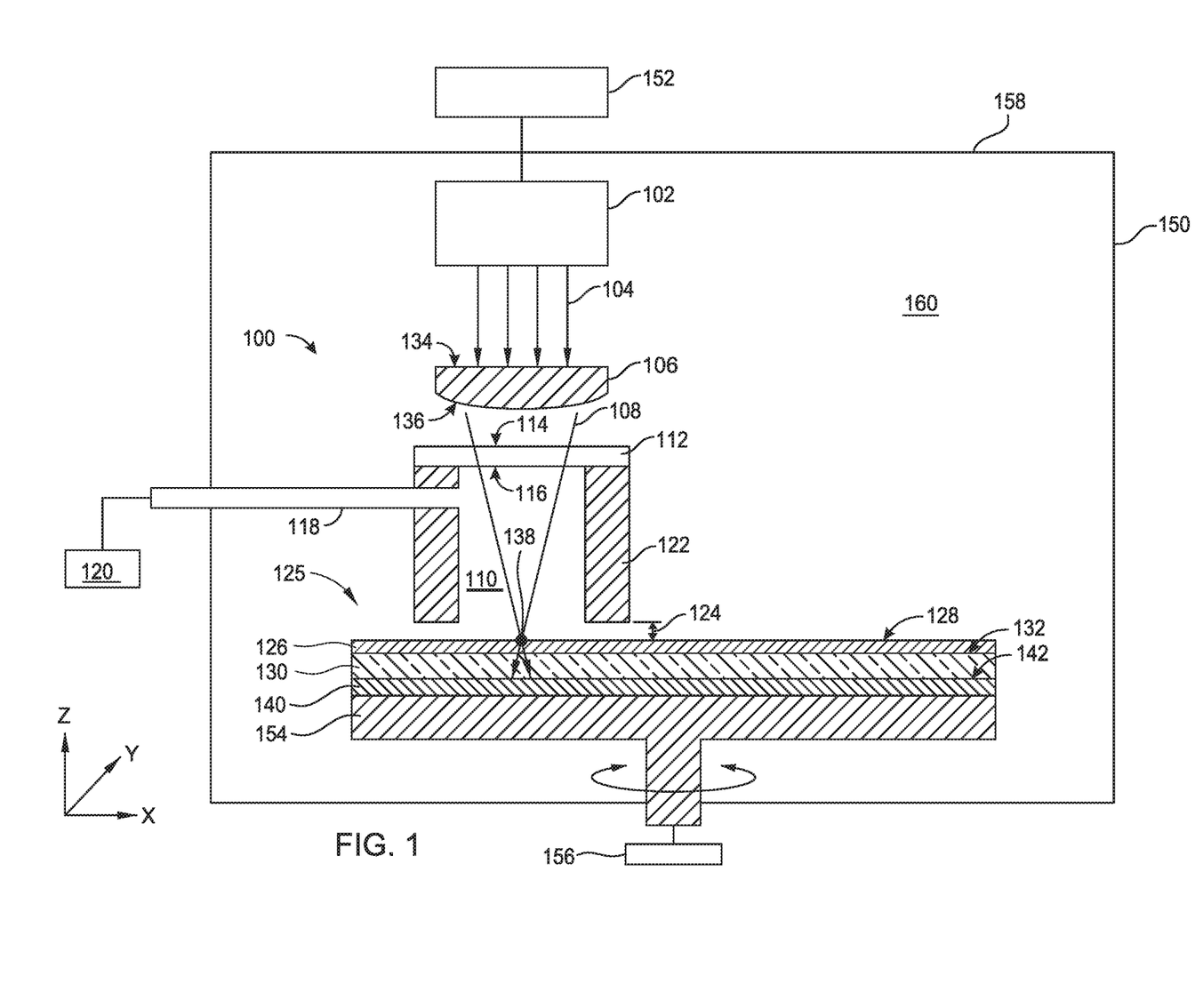
FIG. 1 illustrates a schematic cross-sectional view of an ablation apparatus according to an embodiment of the disclosure.

FIG. 1 illustrates a schematic cross-sectional view of an ablation apparatus 100 according to an embodiment of the disclosure. A chamber body 150 and lid assembly 158 define a volume 160. In one embodiment, the chamber body 150 and the lid assembly 158 are fabricated from a metallic material, for example, aluminum, stainless steel, or alloys thereof. In another embodiment, the chamber body 150 and the lid assembly 158 are fabricated from ultraviolet-proof plastic materials. The ablation apparatus 100 is disposed within the volume 160. A pedestal 154 is also disposed within the volume 160. In one embodiment, the pedestal 154 is disposed in the volume 160 opposite the ablation apparatus 100. The pedestal 154 is configured to support a photomask 125 during processing. The photomask 125 includes a photomask substrate 130 and one or more films 126 deposited on a surface 132 of the photomask substrate 130 facing the ablation apparatus 100. The one or more films 126 are discussed in greater detail below with respect to FIG. 3.

The ablation apparatus 100 includes a volume 110 at least partially defined by a transparent window 112 and a sidewall 122. The transparent window 112 is coupled to the sidewall 122 and the sidewall 122 extends from the transparent window 112. In one embodiment, the sidewall 122 is fabricated from an opaque material. In another embodiment, the sidewall 122 is fabricated from a transparent material. Suitable materials for fabrication of the sidewall 122 include metallic materials, such as aluminum, stainless steel, or alloys thereof. The sidewall 122 may also be fabricated from polymeric materials, such as plastic materials or the like.

A laser source 102 is disposed within the volume 160. A power source 152 is coupled to the laser source 102 to control electromagnetic energy emitted therefrom. The electromagnetic energy emitted from the laser source 102 is in the form of a laser beam. The laser beam travels into the volume 110 along a propagation path 104. In one embodiment, the laser beam is coherent and collimated. In another embodiment, the laser beam is spatially and/or temporally decorrelated to attenuate an energy density of the laser beam. In one embodiment, the laser source 102 is a pulsed source and emits sequential laser pulses. A frequency of the laser pulses is between about 30 and about 120 per millisecond, or between about 30 kHz and about 120 kHz.

In one embodiment, a duration of the pulsed laser is between about 200 femtoseconds and about 300 femtoseconds, for example about 250 femtoseconds. Thus, the laser source 102 may be considered a femtosecond pulsed laser. The short pulse length of the laser prevents or substantially reduces heat transfer to the material being ablated by the laser. In one embodiment, a wavelength of the electromagnetic energy emitted from the laser source 102 is within a range of between about 100 nm and about 400 nm, such as between about 200 nm and about 375 nm, for example about 355 nm. In one embodiment, a beam spot of the electromagnetic energy is between about 1 micrometer (μm) and 10 μm, for example 5 μm. In one embodiment, a scanning rate of the laser source 102 is between about 0.5 m/s and about 2 m/s, for example between about 1.5 m/s and about 1.8 m/s.

The laser source 102 can be a low power laser source. In one embodiment, the laser source 102 has a power less than about 100 milliwatts (mW). The laser beam emitted from the laser source 102 propagates along the propagation path 104 and is incident on a surface 134 of a lens 106. In one embodiment, the surface 134 of the lens 106 is substantially planar. In another embodiment, the surface 134 of the lens 106 is concave or convex. In one embodiment, the lens is positioned in the volume 160 opposite the pedestal 154. The laser beam propagates through the lens 106 and exits a surface 136. In one embodiment, the surface 136 is concave. In another embodiment, the surface 136 is convex. While the lens 106 is illustrated as a single lens, the lens 106 may include one or more lenses in series (e.g., a compound lens). In one embodiment, the lens 106 is fabricated from a fused silica material. In another embodiment, the lens 106 is fabricated from a quartz material.

The lens 106 can have a high numerical aperture with a short focal length. In one embodiment, the focal length is between about 30 mm and about 110 mm, such as between about 50 mm and 100 mm, for example, about 56 mm. The focal length of the lens 106 may be measured between the surface 136 of the lens 106 and a focal point 138. The laser beam emitted from the laser source 102 is focused by the lens 106 to form a focused beam 108. The focal point 138 of the focused beam 108 is positioned at a surface 128 of the film(s) 126. In one embodiment, the focal point 138 is positioned along a central axis of the volume 110. The surface 128 is a surface of the film(s) 126 deposited on the photomask substrate 130. The lens 106 is coaxial with a central axis of the volume 110.

The photomask substrate 130 is disposed on and supported by the pedestal 154. In one embodiment, the pedestal 154 is configured to rotate about a central axis during processing of the photomask 125. Alternatively or in addition, the pedestal 154 is configured to move in the X and Y directions to position the photomask 125 (or a specific portion thereof) in the path of the focused beam 108. In one embodiment, the pedestal 154 is configured to move in the Z direction to increase or decrease a space 124 between the sidewall 122 and the photomask 125. Moving the pedestal 154 in the Z direction also enables changing of the focal point 138 of the focused beam 108 relative to the surface 128 of the film(s) 126 of the photomask 125. Accordingly, if the film(s) 126 has a non-uniform thickness, the pedestal 154 may be moved in the Z direction to more finely align the focal point 138 on the surface 128 to improve ablation of the material from the photomask 125.

An actuator 156 is coupled to the pedestal 154 to control movement of the pedestal 154 relative to the ablation apparatus 100. The actuator 156 may be a mechanical actuator, an electrical actuator, or a pneumatic actuator or the like which is configured to either rotate the pedestal 154 about the central axis and/or move the pedestal 154 in any of the X, Y, and Z directions. In one embodiment, the actuator 156 is a stepper motor. In one embodiment, the ablation apparatus 100 is stationary within the volume 160 while the pedestal 154 is configured to move such that the surface 128 of the photomask 125 is positioned at the focal point 138 of the laser. Alternatively, the ablation apparatus 100 may be movably disposed with the volume 160 while the pedestal 154 remains stationary.

The lens 106 focuses the laser beam such that the energy of the laser beam is focused at the focal point 138 and de-focused after the laser beam propagates through the photomask 125. As such, an energy density of the laser beam is concentrated at the focal point 138 and the energy density of the laser beam is reduced as the laser beam propagates through the photomask 125.

In one embodiment, the energy density of the focused beam 108 at the focal point 138 is greater than the energy density of the focused beam 108 at a coating 140 disposed on a surface 142 of the photomask substrate 130 opposite the film(s) 126. That is, the laser beam is focused from the surface 128 of the film(s) 126 to the surface 132 of the photomask substrate 130 and is defocused at the surface 142 of the photomask substrate 130 where the coating 140 is adhered to the photomask substrate 130. The laser beam does not etch the photomask substrate 130 because the power of the laser source 102 is less than a threshold to etch the photomask substrate 130. For example, if the power of the laser source 102 is 500 mW, the laser beam will etch the surface 132 of the photomask substrate 130. The laser beam is defocused at the surface 142 of the photomask substrate 130 to substantially reduce or prevent modification of the coating 140 at a location where the laser beam is incident on the surface 142 and the coating 140.

Upon exiting the surface 136 of the lens 106, the focused beam 108 travels to a first surface 114 of the transparent window 112. In one embodiment, the transparent window 112 is fabricated from a fused silica material. In another embodiment, the transparent window 112 is fabricated from a quartz material. In one embodiment, the transparent window 112 has a thickness of between about 1 mm and about 5 mm, such as about 3 mm.

The transparent window 112 does not substantially alter the propagation path of the focused beam 108 propagating therethrough. Thus, the focused beam 108 propagates through the transparent window 112 from the first surface 114 to a second surface 116 of the transparent window 112 without substantial modification or aberration being introduced into the focused beam 108.

The volume 110 is configured to confine particles of the film(s) 126 that are removed from the photomask 125 during laser ablation. For example, ablation of the film(s) 126 may cause particles of the film(s) 126 to break apart from the photomask 125 and travel into the volume 110. Evacuating the particles of the film(s) 126 from the volume 110 prevents or substantially reduces re-deposition of the particles onto the surface 128 of the film(s) 126 and the surface 132 of the photomask substrate 130.

In one embodiment, an exhaust port 118 is formed through the sidewall 122. The exhaust port 118 extends through the chamber body 150. The exhaust port 118 is fluidly connected to an exhaust pump 120 and enables fluid communication between the volume 110 and the exhaust pump 120. The exhaust pump 120 generates a fluid flow path from the volume 110 to the exhaust pump 120 by reducing a pressure in the volume 110 to evacuate particles from the volume 110. That is, a pressure in the volume 110 may be slightly less than an atmospheric pressure external to the volume 110.

The sidewall 122 is spaced apart from the film(s) 126 deposited on the photomask substrate 130. The space 124 between the sidewall 122 and the photomask 125 enables a fluid to flow between the sidewall 122 and the photomask 125 and into the exhaust port 118. The fluid flow from the space 124 to the exhaust port 118 facilitates film particle removal from the volume 110 and prevents or substantially reduces re-deposition of the particles on the photomask 125. Together, the sidewall 122, exhaust port 118, and transparent window 112 form a fume extraction hood that evacuates particles from the volume 110.

Figure 2:
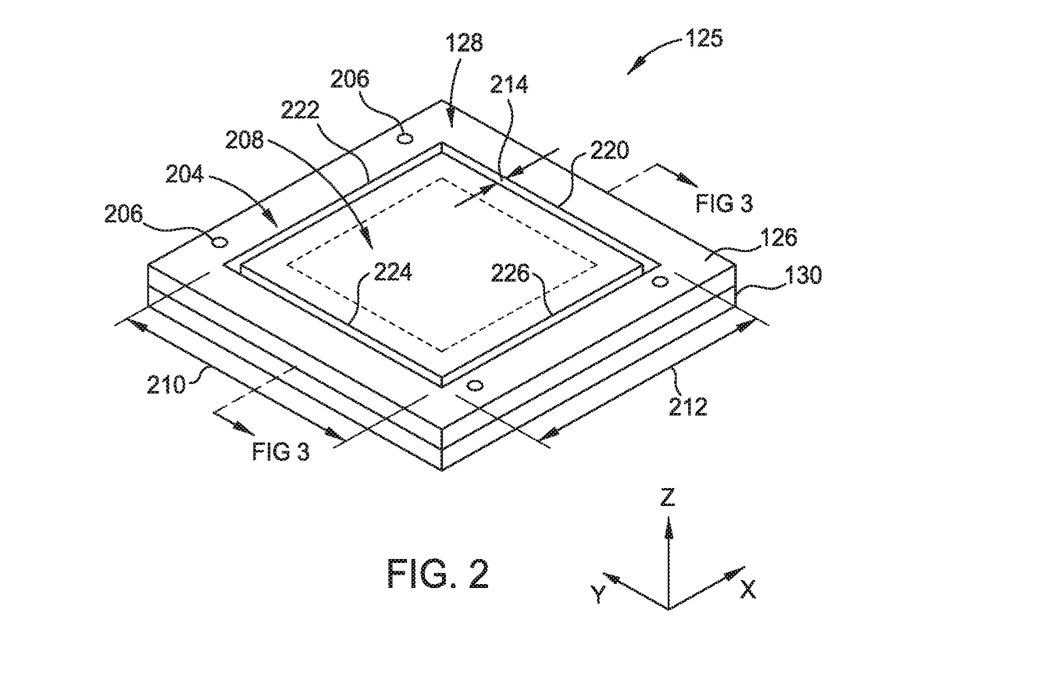
FIG. 2 illustrates a perspective view of a photomask according to an embodiment of the disclosure.

FIG. 2 illustrates a perspective view of the photomask 125 according to an embodiment of the disclosure. The photomask 125 includes the photomask substrate 130 and the one or more films 126 deposited thereon. A black border 204 and one or more pellicle anchor areas 206 are formed through the one or more films 126. In one embodiment, the pellicle anchor areas 206 are cylindrical and have a diameter of about 6 mm. In one embodiment, the black border 204 and the pellicle anchor areas 206 are formed through the one or more films 126 using a laser source, such as the laser source 102 illustrated in FIG. 1. The laser source 102 ablates the one or more films to form the black border 204 and the pellicle anchor areas 206.

The black border 204 surrounds a pattern area 208 formed on the photomask 125. The pattern area 208 includes transparent portions (not shown) that allow EUV light to be reflected and opaque portions (not shown) that reduce an amount of reflected EUV light, creating a pattern of light and shadows on the substrate being processed. The black border 204 is formed through the one or more films 126 between the pattern area 208 and the pellicle anchor areas 206.

The black border 204 includes a first portion 220, a second portion 222, a third portion 224, and a fourth portion 226. The first portion 220 extends along and is parallel to an outer edge of the photomask 125. The second portion 222 extends between and is perpendicular to the first portion 220 and the third portion 224. The third portion 224 is opposite and parallel to the first portion 220. The fourth portion 226 extends between and is perpendicular to the first portion 220 and the third portion 224. The fourth portion 226 is opposite and parallel to the second portion 222.

A length 210 of the first portion 220 and the third portion 224 and a length 212 of the second portion 222 and the fourth portion 226 is between about 75 mm and about 150 mm, for example between about 100 mm and about 150 mm. A width 214 of the black border is between about 1.5 mm and about 5 mm, for example between about 2 mm and about 3 mm. In one embodiment, a width 214 of the first portion 220 and the third portion 224 is different than a width of the second portion 222 and the fourth portion 226. For example, the width 214 of the first portion 220 and the third portion 224 may be about 2 mm while the width 214 of the second portion 222 and the fourth portion 226 is about 3 mm.

Figure 3:
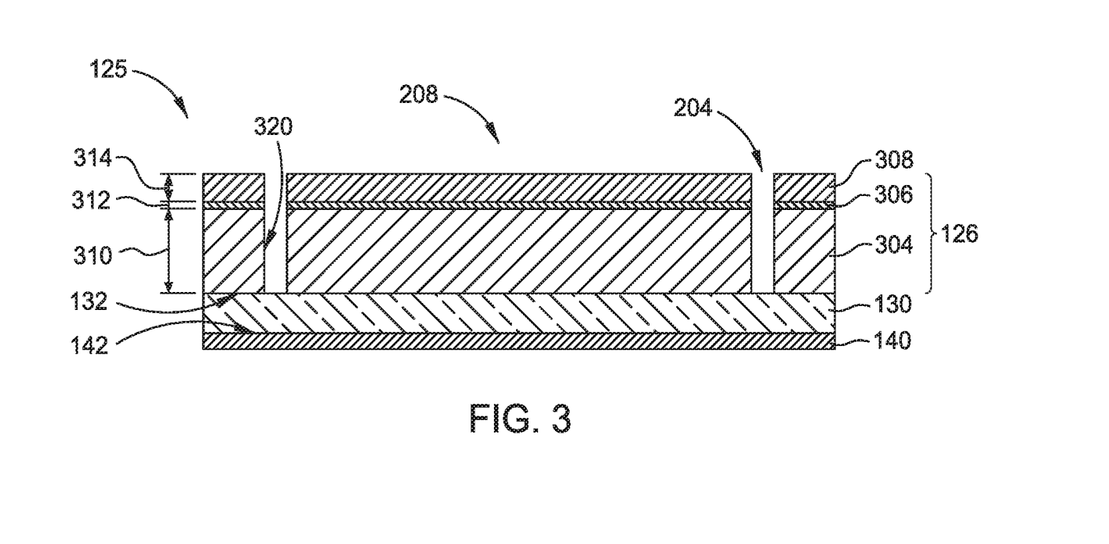
FIG. 3 illustrates a schematic cross-sectional view of the photomask of FIG. 2 according to an embodiment of the disclosure.

FIG. 3 illustrates a schematic cross-sectional view of the photomask 125 according to an embodiment of the disclosure. The photomask 125 includes the photomask substrate 130 with the one or more films 126 disposed thereon. The photomask substrate 130 is fabricated from a material with a low coefficient of thermal expansion (CTE) to reduce a displacement of the photomask substrate 130 if heated. In one embodiment, the photomask substrate 130 is fabricated from a fused silica based material. In another embodiment, the photomask substrate 130 is fabricated from a material including fused silica and a metal oxide.

The coating 140 is disposed on the surface 142 of the photomask substrate 130. Various films (e.g., film(s) 126) are deposited on the surface 132 of the photomask substrate 130 opposite the surface 142. The films include a multilayer stack 304, a capping layer 306, and an absorber layer 308. A total thickness of the stacked films 304, 306, 308 is between about 300 nm and about 400 nm. A photoresist (not shown) may be disposed on the absorber layer 308 for patterning and etching the absorber layer 308. A thickness of the photoresist is between about 40 nm and about 180 nm, for example between about 50 nm and about 150 nm, such as about 100 nm.

The multilayer stack 304 is disposed on and adhered to the surface 132 of the photomask substrate 130. The multilayer stack 304 includes a plurality of layers fabricated from a silicon containing material and a plurality of layers fabricated from a molybdenum containing material. In one embodiment, each of the silicon layers corresponds to a molybdenum layer forming a plurality of paired layers. In one embodiment, the silicon layers and the molybdenum layers alternate to form the multilayer stack 304. The multilayer stack 304 includes about 40 pairs of silicon and molybdenum layers. A thickness 310 of the multilayer stack is between about 260 nm and about 290 nm. A thickness of the silicon layers is between about 3 nm and about 5 nm, for example about 4.1 nm. A thickness of the molybdenum layers is between about 2 nm and about 3 nm, for example about 2.7 nm.

The capping layer 306 is disposed on and adhered to the multilayer stack 304 opposite the photomask substrate 130. The capping layer 306 is fabricated from a ruthenium containing material. A thickness 312 of the capping layer is between about 1 nm and about 3 nm, for example about 2.5 nm.

The absorber layer 308 is disposed on and adhered to the capping layer 306 opposite the multilayer stack 304. The absorber layer 308 includes an anti-reflective coating (ARC) and a bulk absorber layer. A thickness 314 of the absorber layer 308 is between about 30 nm and about 80 nm, for example about 60 nm. In one embodiment, the absorber layer 308 is made from more than one layer. For example, a first portion of the absorber layer 308 in contact with the capping layer 306 may be fabricated from a tantalum boron nitride containing material. In one embodiment, the first portion of the absorber layer 308 is the anti-reflective coating. A second portion of the absorber layer 308 opposite the capping layer 306 may be fabricated from a tantalum boron oxide containing material. In one embodiment, the second portion of the absorber layer 308 is the bulk absorber layer.

The black border 204 is formed through the absorber layer 308, the capping layer 306, and the multilayer stack 304. In one embodiment, the black border 204 is formed through the layers 304, 306, and 308 using a laser source, such as the laser source 102 illustrated in FIG. 1. In one embodiment, a plasma etch process is used to remove the absorber layer 308 from the black border 204 and the pellicle anchor areas, such as the pellicle anchor areas 206 illustrated in FIG. 2. In that case, the laser source is used to remove the capping layer 306 and multilayer stack 304 from the black border 204 and pellicle anchor areas to expose the photomask substrate 130.

A single pass of the laser beam ablates the capping layer 306 and the multilayer stack 304. However, multiple passes of the laser beam over an area of the photomask increases a smoothness of a sidewall 320 of the black border 204.

The laser source used to remove the capping layer 306 and multilayer stack 304 from the black border 204 may also be used to remove any remaining photoresist remaining on the photomask 125 in areas other than the black border 204 and pellicle anchor areas, such as the pellicle anchor areas 206 illustrated in FIG. 2.

Figure 4:
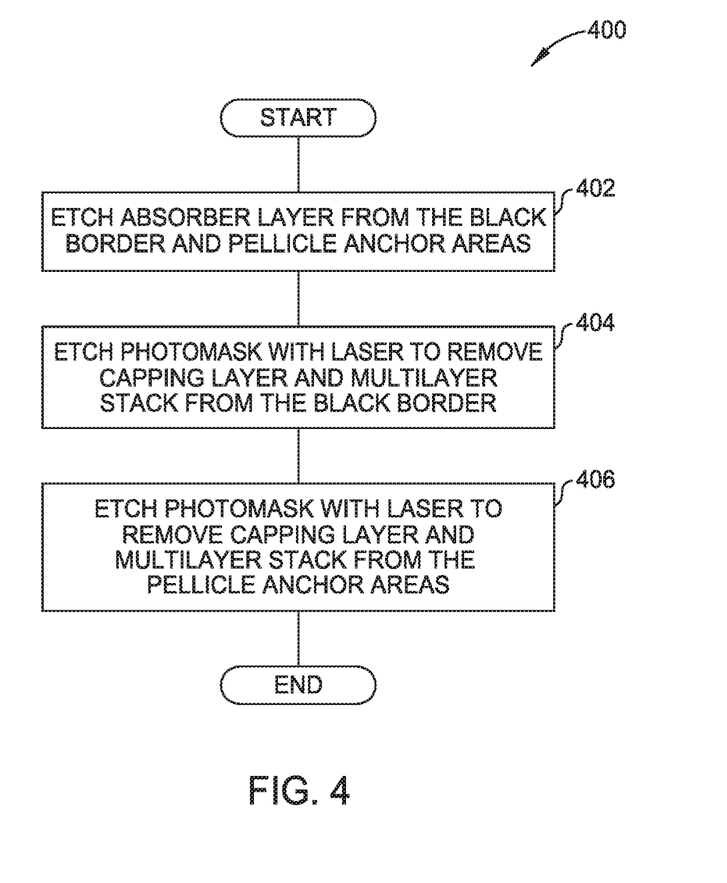
FIG. 4 illustrates operations of a method for processing a photomask according to an embodiment of the disclosure.

FIG. 4 illustrates operations of a method 400 for processing a photomask according to an embodiment of the disclosure. As shown, the method 400 begins at operation 402 where the absorber layer of a photomask, such as the absorber layer 308 illustrated in FIG. 3, is etched from the black border and pellicle anchor areas. In one embodiment, the absorber layer is etched using a plasma etch. In embodiments where a photoresist is disposed on the photomask, an area of the photoresist may be removed from the photomask corresponding to the black border and the pellicle anchor areas prior to the plasma etch. Etching the absorber layer exposes one or more layers or films of the photomask.

At operation 404, a laser etch is performed on the photomask to remove the capping layer and the multilayer stack from the area of the black border. As discussed with respect to FIG. 1, the laser used to etch the photomask is a low power laser to prevent heat transfer to the films disposed on the photomask and to prevent damage to the photomask substrate. Removing the capping layer and multilayer stack from the black border area exposes a surface of the photomask substrate.

At operation 406, a laser etch is performed on the photomask to remove the capping layer and the multilayer stack from the pellicle anchor areas on the photomask. Removing the capping layer and multilayer stack from the pellicle anchor areas exposes the surface of the photomask substrate.

Figure 5:
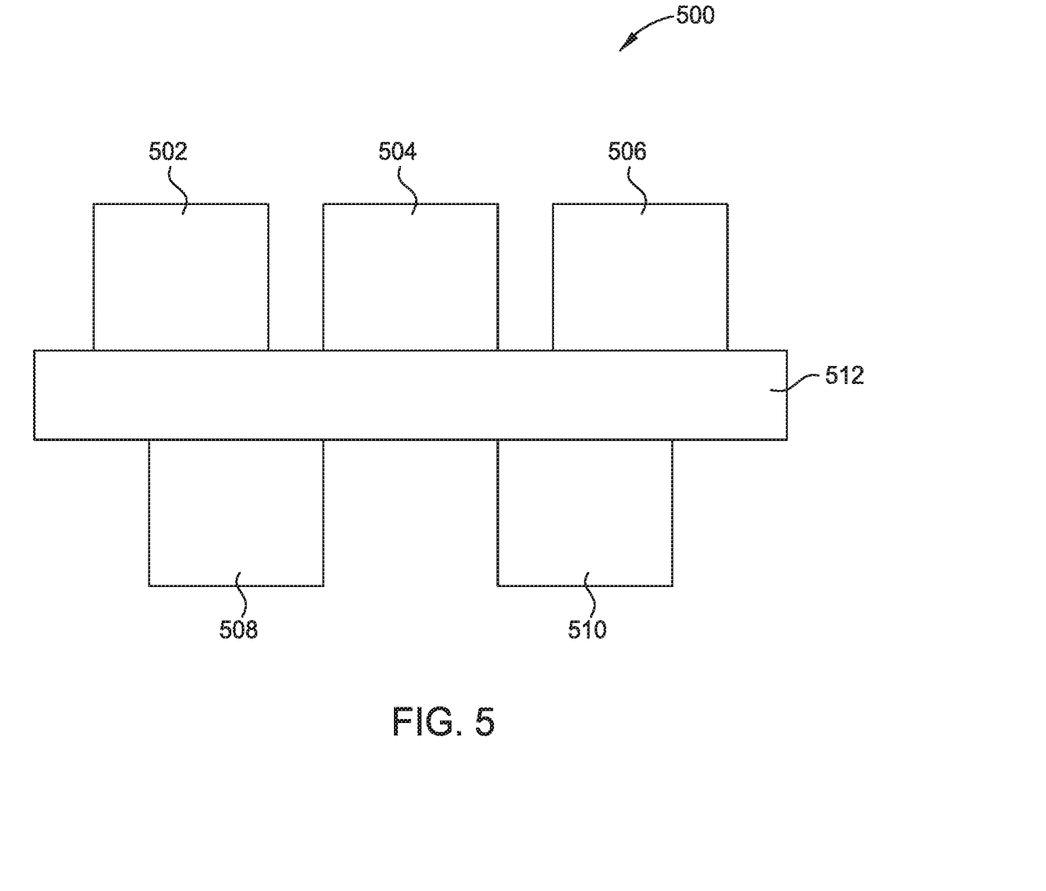
FIG. 5 illustrates a schematic plan view of a tool including a laser etch chamber according to an embodiment of the disclosure.

FIG. 5 illustrates a plan view of a tool 500 including a laser etch chamber according to an embodiment of the disclosure. As illustrated, the tool 500 includes a plurality of chambers 502, 504, 506 connected to a transfer chamber 512. The transfer chamber 512 enables transfer of a photomask between the chambers 502, 504, 506. The tool 500 includes a cleaning chamber 502, a plasma chamber 504, a laser etch chamber 506, and one or more standard mechanical interface (SMIF) pods 508 and 510. Alternatively or in addition, the tool 500 may include one or more front opening unified pods (FOUP) in place of the SMIF pods 508, 510. It is contemplated that the order, arrangement, or location of the chambers 502, 504, and 506 and SMIF pods 508 and 510 can be altered without departing from the scope of the embodiments described herein.

The one or more SMIF pods (or FOUPs) 508 and 510 are used to transport one or more photomasks between the tool 500 and other tools. The SMIF pods 508 and 510 are containers with a controlled environment therein for isolating the one or more photomasks from contamination.

A photomask from one of the SMIF pods 508, 510 is received in the transfer chamber 512 by a transfer robot (not shown). The transfer robot is configured to transport one or more photomasks between the SMIF pods 508, 510 and the chambers 502, 504, 506.

The cleaning chamber 502 is high frequency cleaning chamber for cleaning a photomask. In one embodiment, the cleaning chamber 502 is a megasonic or ultrasonic cleaning chamber. An example of a suitable apparatus which may be utilized for cleaning a photomask in accordance with the embodiments described herein is the RETIClean® tool, available from Applied Materials, Inc., Santa Clara, Calif.

The plasma chamber 504 is used to strip (e.g., remove) photoresist. In one embodiment, the photoresist is removed from the photomask in the plasma chamber 504 after the pattern is etched onto the photomask using a pattern etch tool (not shown), and after the black border and pellicle anchor areas are etched in the laser etch chamber 506. An example of a suitable apparatus which may be utilized for stripping the photoresist in accordance with the embodiments described herein is the AXIOM® tool, available from Applied Materials, Inc., Santa Clara, Calif. In one embodiment, the absorber layer is etched in the areas of the black border and the pellicle anchor areas using the pattern etch tool (not shown). In another embodiment, the absorber layer is etched in the areas of the black border and the pellicle anchor areas in the laser etch chamber 506.

The laser etch chamber 506 includes a laser source for ablating one or more layers from the black border and one or more pellicle anchor areas of a photomask. In one embodiment, the laser etch chamber 506 corresponds to the chamber body 150 and lid assembly 158 housing the ablation apparatus 100 illustrated in FIG. 1.

In operation, a photomask is transferred from a SMIF pod 508, 510 to the laser etch chamber 506 via the transfer chamber 512. In one embodiment, the photoresist, the absorber layer, the capping layer, and the multilayer stack, each disposed on the photomask, are etched from black border and pellicle anchor areas on the photomask in the laser etch chamber 506. The photomask is transferred, via the transfer chamber 512, from the laser etch chamber 506 to the plasma chamber 504. The photomask is then transferred to the cleaning chamber 502, via the transfer chamber 512, where an ultrasonic or megasonic cleaning processed is performed on the photomask. In one embodiment, the cleaning process in the cleaning chamber 502 prepares the photomask for a metrology process and subsequent processing or inspection.

In summary, embodiments disclosed eliminate multiple lithography steps with a laser etch process. That is, the ablation apparatus and methods disclosed herein reduce the complexity of processing a photomask and substantially reduce the occurrence of damage to the photomask.

While the foregoing is directed to embodiments of the present disclosure, other and further embodiments of the disclosure may be devised without departing from the basic scope thereof, and the scope thereof is determined by the claims that follow.

What is claimed is:
1. A laser etch method, comprising:
   etching a photomask to remove a first layer disposed on the photomask from a black border and one or more pellicle anchor areas;
   etching the photomask with a femtosecond laser and a lens having a focal length of between about 30 mm and about 110 mm to remove at least a second layer disposed on the photomask from the black border; and
   etching the photomask with the femtosecond laser to remove the at least the second layer from the one or more pellicle anchor areas.
2. The method of claim 1, wherein the etching the photomask to remove the first layer is performed in a plasma etch chamber.
3. The method of claim 1, wherein a laser source of the femtosecond laser has a power of about 100 mW or less.
4. The method of claim 3, further comprising:
   positioning the photomask having the at least the second layer disposed thereon in a path of a laser beam emitted from the laser source;
   projecting the laser beam through the lens positioned between the laser source and the photomask;
   focusing the laser beam with the lens at a focal point on a surface of the photomask, the focal point positioned in the black border on the photomask; and
   sublimating the at least the second layer in the black border with the laser beam focused thereon.
5. The method of claim 1, wherein the black border surrounds a pattern area on the photomask.
6. The method of claim 5, wherein the black border is disposed between the pattern area and the one or more pellicle anchor areas.

7. The method of claim 6, wherein electromagnetic energy emitted from the femtosecond laser removes more than one layer from the photomask.

8. An apparatus for removing material from a photomask, the apparatus comprising:
- a chamber body and lid assembly defining a first volume therein;
- a pedestal disposed within the first volume and capable of supporting the photomask;
- a lens disposed in the chamber body opposite the pedestal, the lens having a focal length of between about 30 mm and about 110 mm; and
- an ablation apparatus positioned within the first volume, the ablation apparatus comprising:
  - a sidewall surrounding a second volume; and
  - a femtosecond laser source configured to emit a laser beam through the lens and through the second volume to remove material from the photomask without damaging the photomask, the laser source having a power of about 100 mW or less.

9. The apparatus of claim 8, wherein the sidewall of the ablation apparatus is spaced apart from the pedestal by a distance.

10. The apparatus of claim 8, further comprising:
- an exhaust port formed through the sidewall of the ablation apparatus.

11. The apparatus of claim 8, wherein the femtosecond laser source comprises:
- a femtosecond pulsed laser source configured to generate electromagnetic energy with a beam spot of about 5 µm.

12. The apparatus of claim 11, wherein a focal point of the electromagnetic energy is positioned along a central axis of the second volume and at a surface of the material being removed.

13. The apparatus of claim 11, the ablation apparatus further comprising:
- a transparent window disposed in a propagation path of the electromagnetic energy, wherein the lens is disposed between the transparent window and the pulsed laser source, the lens is disposed within and normal to the propagation path of the electromagnetic energy, and the lens is coaxial with the second volume.

14. The apparatus of claim 13, wherein the lens is a compound lens.

15. An apparatus for processing a photomask, the apparatus comprising:
- a cleaning chamber;
- a plasma chamber for removing photoresist from a photomask; and
- a laser etch chamber, the laser etch chamber comprising:
  - a chamber body and lid assembly defining a first volume therein;
  - a pedestal disposed within the first volume and capable of supporting the photomask;
  - a lens disposed within the first volume opposite the pedestal, the lens having a focal length of between about 30 mm and about 110 mm; and
  - an ablation apparatus disposed within the first volume between the lens and the pedestal, the ablation apparatus comprising:
    - a sidewall surrounding a second volume; and
    - a femtosecond laser source configured to emit a laser beam through the second volume to remove material from the photomask without damaging the photomask, the laser source having a power of about 100 mW or less.

16. The apparatus of claim 15, wherein the lens is a compound lens.

17. The apparatus of claim 15, wherein the sidewall of the ablation apparatus is spaced apart from the pedestal by a distance.

18. The apparatus of claim 15, wherein the femtosecond laser source comprises:
- a femtosecond pulsed laser source configured to generate electromagnetic energy with a beam spot of about 5 µm.

19. The apparatus of claim 18, the ablation apparatus further comprising:
- a transparent window disposed in a propagation path of the electromagnetic energy, wherein the lens is disposed within and normal to the propagation path of the electromagnetic energy, the lens is disposed between the pulsed laser source and the transparent window, and the lens is coaxial with the second volume.

20. The apparatus of claim 19, wherein a focal point of the electromagnetic energy is positioned along a central axis of the second volume and at a surface of the material being removed.

* * * * *